United States Patent
Evans et al.

(10) Patent No.: US 8,964,446 B2
(45) Date of Patent: Feb. 24, 2015

(54) ANALOG MEMORIES UTILIZING FERROELECTRIC CAPACITORS

(71) Applicant: Radiant Technologies, Inc., San Ramon, CA (US)

(72) Inventors: Joseph T. Evans, Albuquerque, NM (US); Calvin B. Ward, Castro Valley, CA (US)

(73) Assignee: Radiant Technologies, Inc., Albuquerque, NM (US)

( * ) Notice: Subject to any disclaimer, the term of this patent is extended or adjusted under 35 U.S.C. 154(b) by 0 days.

(21) Appl. No.: 14/274,616

(22) Filed: May 9, 2014

(65) Prior Publication Data

US 2014/0247643 A1    Sep. 4, 2014

Related U.S. Application Data

(63) Continuation of application No. 12/956,845, filed on Nov. 30, 2010, now Pat. No. 8,760,907.

(51) Int. Cl.
*G11C 11/22*    (2006.01)

(52) U.S. Cl.
CPC .......... *G11C 11/221* (2013.01); *G11C 11/2273* (2013.01); *G11C 11/2275* (2013.01)
USPC ...................... 365/145; 365/129; 365/189.011

(58) Field of Classification Search
USPC .................. 365/145, 189, 15, 189.16, 222
See application file for complete search history.

(56) References Cited

U.S. PATENT DOCUMENTS

| | | | | |
|---|---|---|---|---|
| 6,118,688 A * | 9/2000 | Hirano et al. | ................. | 365/145 |
| 2002/0145903 A1* | 10/2002 | Hasegawa | ..................... | 365/145 |
| 2005/0174841 A1* | 8/2005 | Ho | ........................... | 365/185.03 |

* cited by examiner

*Primary Examiner* — Son Dinh
*Assistant Examiner* — Uyen B Tran
(74) *Attorney, Agent, or Firm* — Calvin B. Ward

(57) ABSTRACT

A ferroelectric memory having a plurality of ferroelectric memory cells, each ferroelectric memory cell including a ferroelectric capacitor is disclosed. The ferroelectric memory includes read and write lines and a plurality of ferroelectric memory cell select buses, one select bus corresponding to each of the ferroelectric memory cells. Each of the ferroelectric memory cells includes first and second gates for connecting the ferroelectric memory cell to the read line and the write line, respectively, in response to signals on the ferroelectric memory cell select bus corresponding to that ferroelectric memory cell. A write circuit causes a charge to be stored in the ferroelectric capacitor of the ferroelectric memory cell currently connected to the write line, the charge having a value determined by a data value having at least three states. A read circuit measures the charge stored in the ferroelectric capacitor of the ferroelectric memory cell currently connected to the read line to generate an output value, the output value corresponding to one of the states.

7 Claims, 11 Drawing Sheets

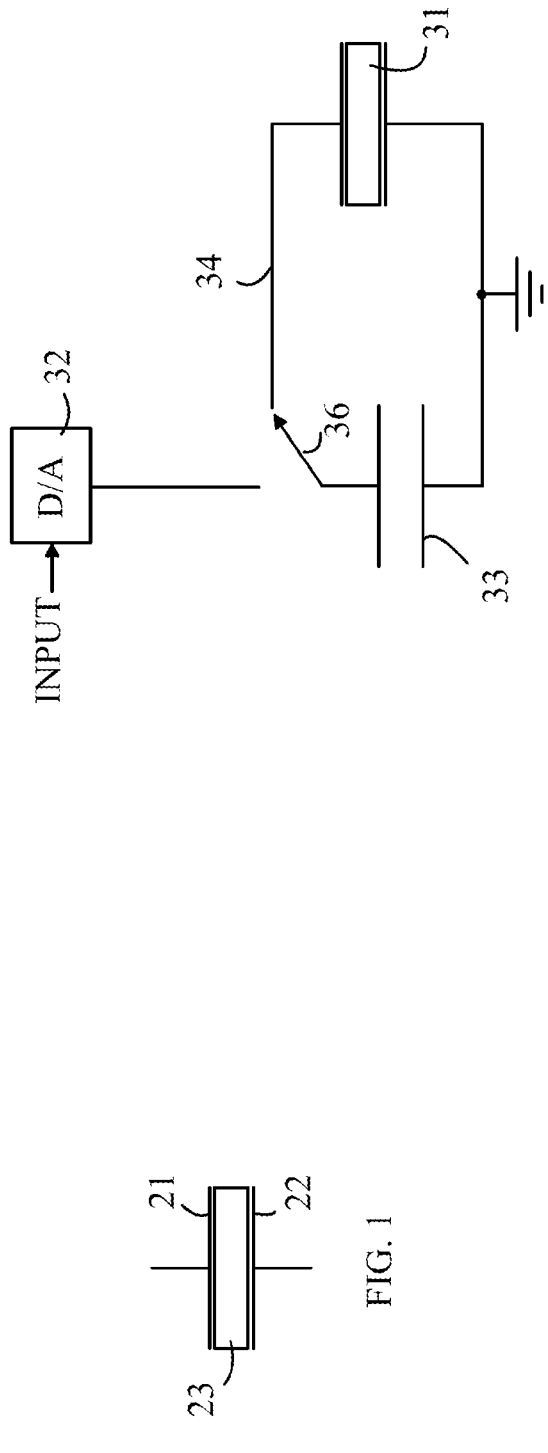
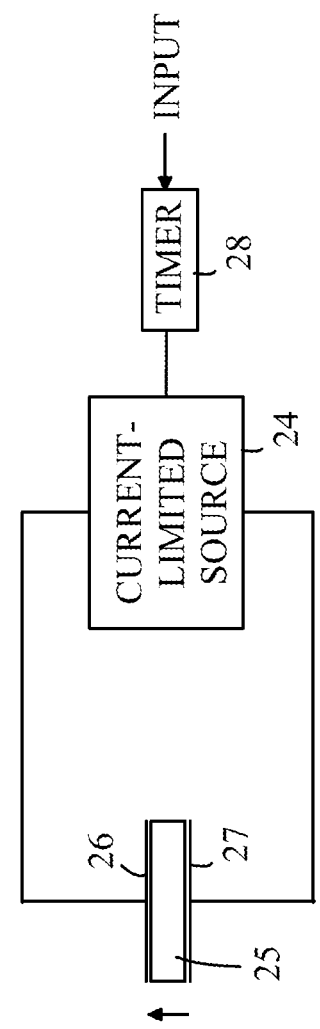
FIG. 1
FIG. 2
FIG. 3

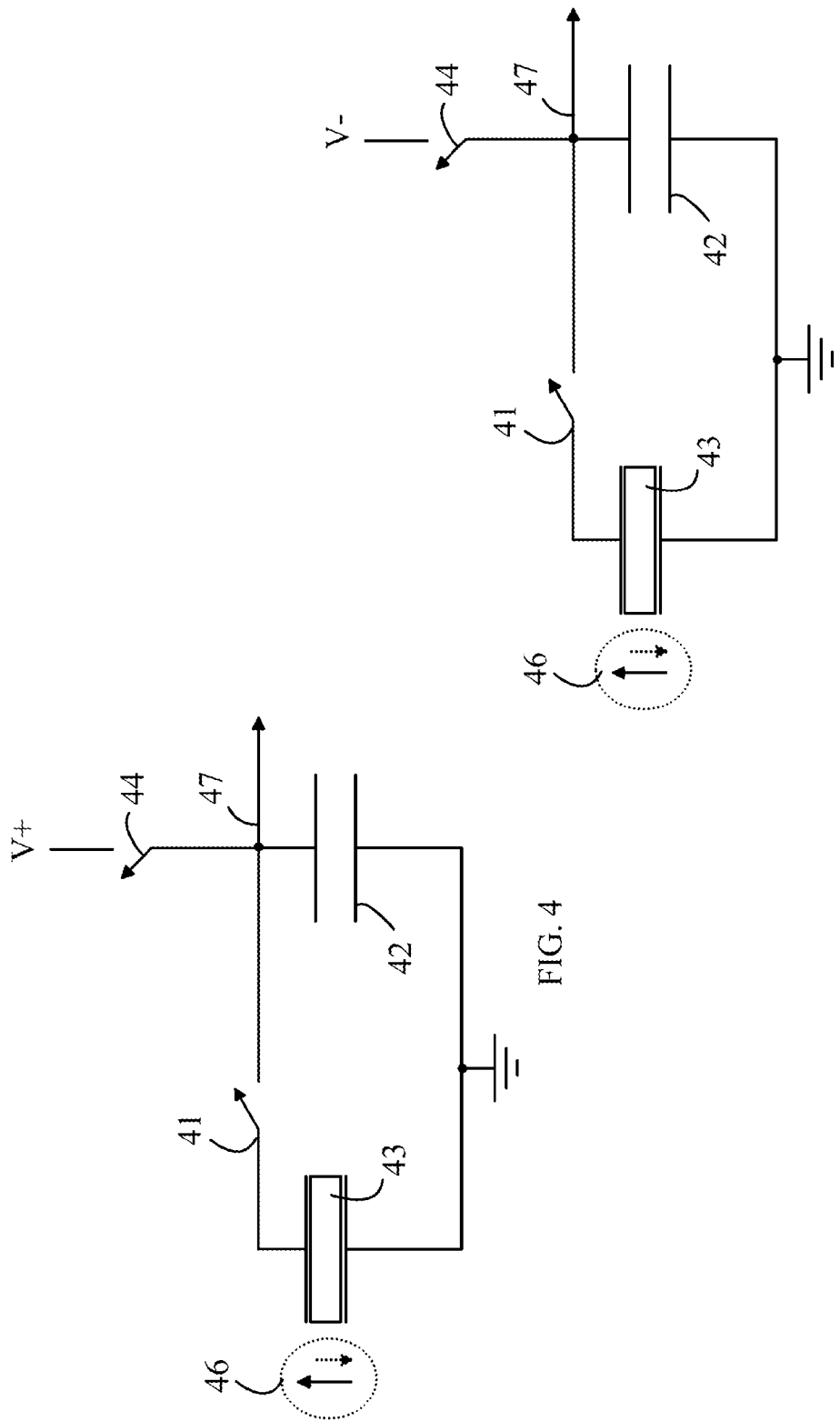

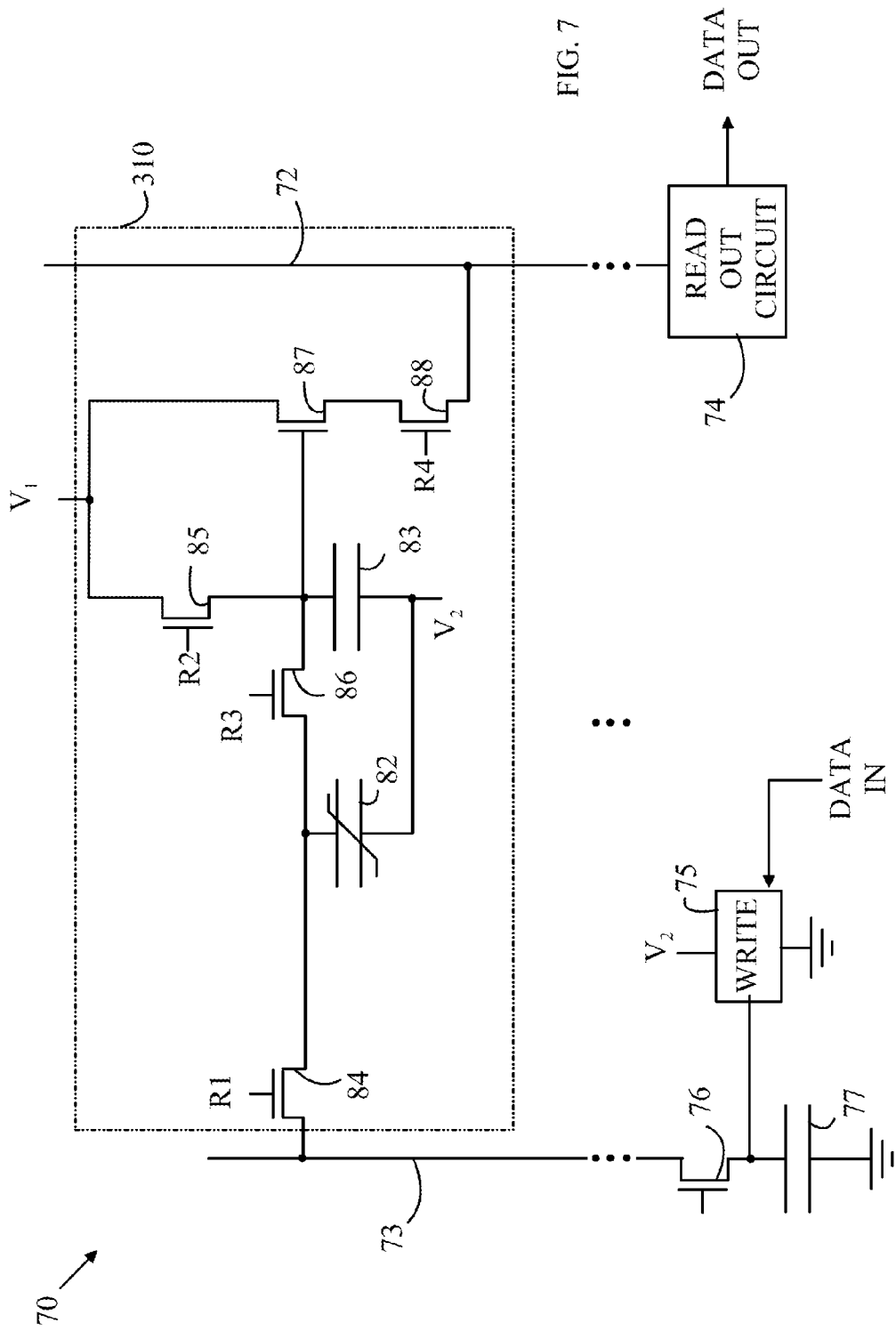

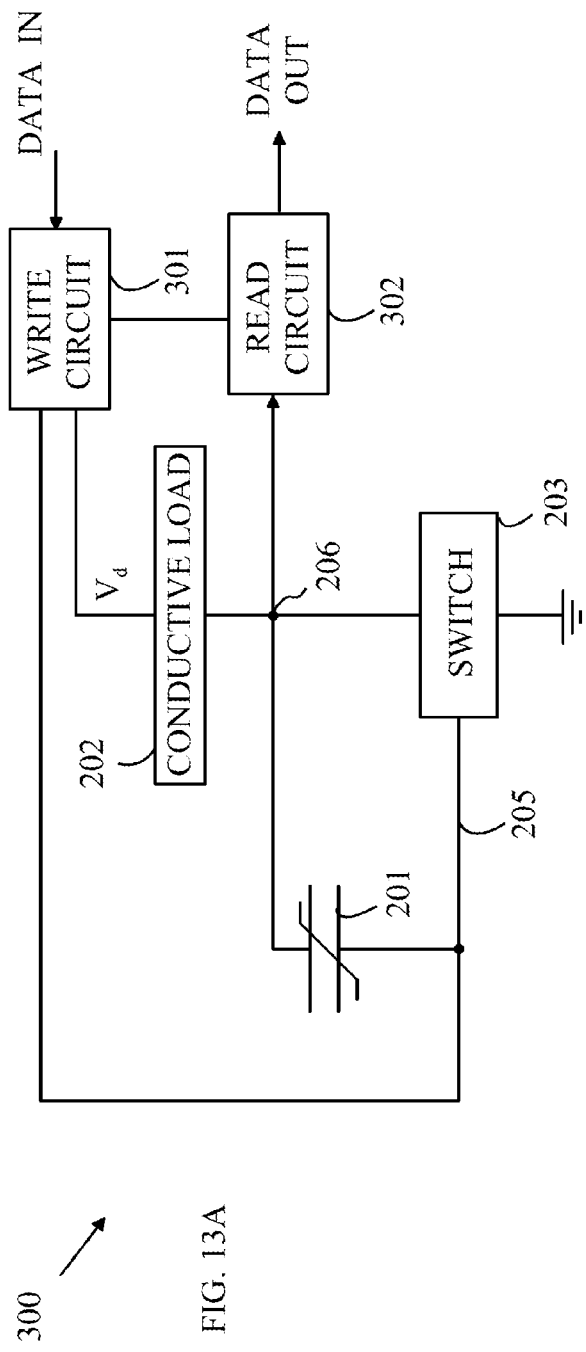
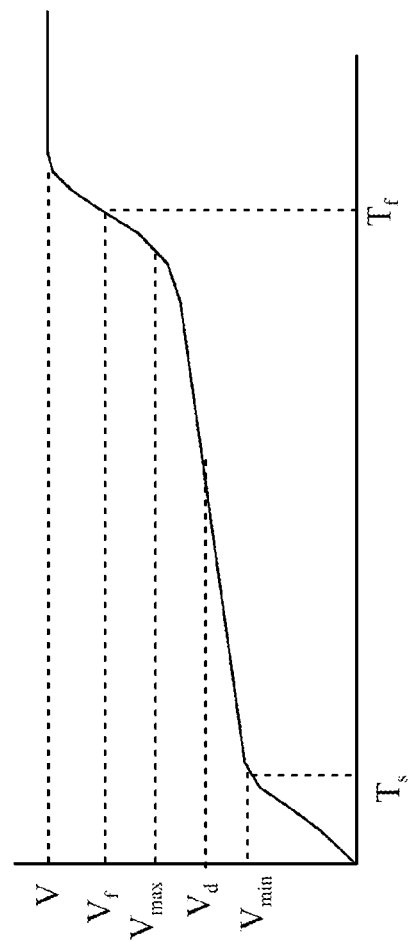
FIG. 13A
FIG. 13B

ANALOG MEMORIES UTILIZING FERROELECTRIC CAPACITORS

RELATED APPLICATIONS

This application is a continuation of co-pending application Ser. No. 12/956,845 filed Nov. 30, 2010, now U.S. Pat. No. 8,760,907, and claims priority based on that application.

BACKGROUND OF THE INVENTION

Non-volatile solid-state EEPROM memories have become competitive with conventional rotating magnetic disk media for large-scale data storage in applications requiring high speed and/or low power consumption. Such memories have much shorter effective "seek" times and data transfer rates that are as fast or faster than the conventional disk drives. In addition, these memories can withstand significant mechanical shocks and require a fraction of the power of conventional disk drives. The cost of such memories, however, still places limitations on the use of the drives. In addition, such memories are not useable in high radiation environments.

One method for reducing the cost of such memories utilizes memory cells that have more than two storage states. For example, in EEPROM memories, a charge is deposited on a floating gate using tunneling. The charge alters the conductivity of the associated transistor. In a binary memory, the presence or absence of the charge is all that needs to be sensed. In a multi-state memory, each state corresponds to a different amount of charge being transferred to the gate. To read the cell, the conductivity of the cell must be measured to differentiate between the possible states. Since each cell now stores multiple bits of data, the cost of the memory is substantially reduced for any given memory size.

Unfortunately, the time to write such a cell is significantly greater than the time to write a binary cell. Furthermore, the maximum number of states that can be stored in a memory cell is limited. These problems can be partially overcome by increasing the number of sense amplifiers in the memory so that a large number of cells are read or written simultaneously. However, this approach increases the cost of the memory and still imposes an initial read time for a "track" that is longer than the read times for reading out individual segments of the track once the track has been loaded.

When data is to be rewritten in a record, the entire record must be erased and then the new data entered. Since the erase time is long compared to the write time, data is rewritten to unused records that have been erased. The records that were abandoned in a prior rewrite are then erased in the background. This "garbage collection" procedure further complicates the memories and increases the cost. Finally, the number of times a cell can be erased and rewritten is limited, and hence, the lifetime of the memory can be a problem in applications that require a large number of cells to be erased and rewritten a large number of times.

SUMMARY OF THE INVENTION

The present invention includes a ferroelectric memory having a plurality of ferroelectric memory cells, each ferroelectric memory cell including a ferroelectric capacitor. The ferroelectric memory includes read and write lines and a plurality of ferroelectric memory cell select buses, one select bus corresponding to each of the ferroelectric memory cells. Each of the ferroelectric memory cells includes first and second gates for connecting the ferroelectric memory cell to the read line and the write line, respectively, in response to signals on the ferroelectric memory cell select bus corresponding to that ferroelectric memory cell. A write circuit causes a charge to be stored in the ferroelectric capacitor of the ferroelectric memory cell currently connected to the write line, the charge having a value determined by a data value having at least three states. A read circuit measures the charge stored in the ferroelectric capacitor of the ferroelectric memory cell currently connected to the read line to generate an output value, the output value corresponding to the stored state.

BRIEF DESCRIPTION OF THE DRAWINGS

FIG. 1 illustrates a typical ferroelectric capacitor.

FIG. 2 illustrates the basic programming principle used in the present invention and one possible programming arrangement.

FIG. 3 illustrates another programming arrangement.

FIG. 4 illustrates a simplified readout circuit based on reading the charge stored on a ferroelectric capacitor.

FIG. 5 is a simplified readout circuit according to another embodiment of the present invention.

FIG. 7 illustrates one embodiment of a ferroelectric memory according to the present invention that utilizes a storage scheme in which data is readout by measuring the amount of charge that was stored in the ferroelectric capacitor during the writing operation.

FIG. 13A illustrates another embodiment of a write circuit that can be utilized to set the state of polarization of the ferroelectric capacitor.

FIG. 13B illustrates data written to a ferroelectric capacitor by converting the input data to a voltage.

DETAILED DESCRIPTION OF THE PREFERRED EMBODIMENTS OF THE INVENTION

Figure 6:
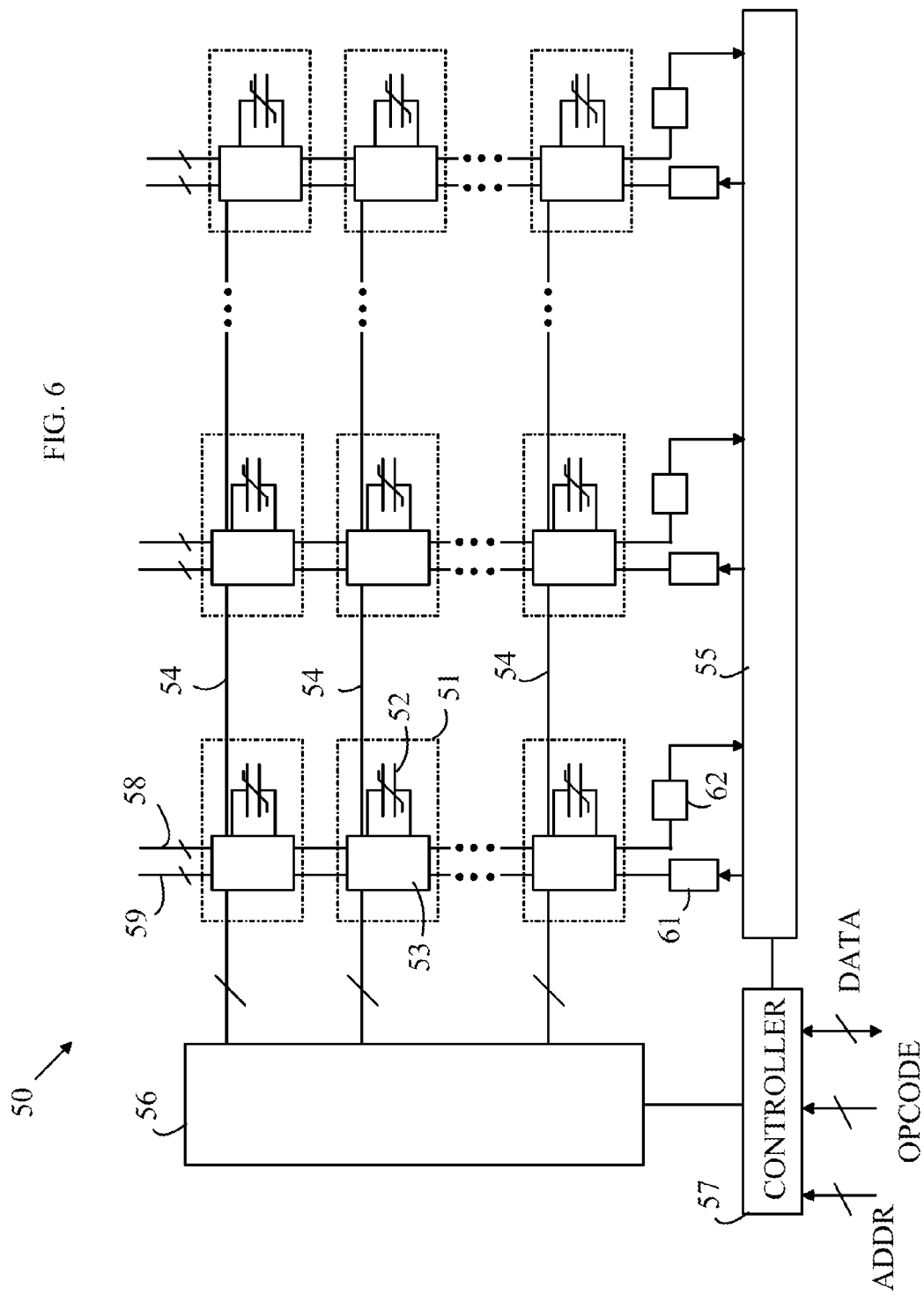
FIG. 6 illustrates one embodiment of an analog ferroelectric memory according to the present invention.

Refer now to FIG. 1, which illustrates a typical ferroelectric capacitor. For the purposes of this discussion, a ferroelectric capacitor is defined to be a capacitor having a ferroelectric dielectric material such as lead zirconate titanate (PZT) sandwiched between first and second electrodes in which the dielectric material exhibits a remanent polarization when a potential is applied across the electrodes and then removed. The simplest form of capacitor is a parallel plate capacitor having electrodes 21 and 22 in which a dielectric layer 23 includes a ferroelectric material such as PZT. To simplify the following discussion, a ferroelectric capacitor having a single pair of parallel plates that sandwich the dielectric will be used in the examples. However, other geometries are possible. For example, a capacitor having interdigitated electrodes (interlaced fingers) with a dielectric between each pair of electrodes could also be utilized.

The dielectric layer can be polarized by applying an appropriate voltage across the electrodes of the capacitor. The state of polarization can be characterized by the direction in which the domains within the dielectric layer are aligned. The ferroelectric capacitor will be said to be polarized in the "up" direction if the direction of polarization corresponds to the case in which the polarizing potential creates an electric field that points from electrode 22 to electrode 21. Similarly, the ferroelectric capacitor will be said to be polarized in the "down" direction if the direction of polarization corresponds to the case in which the polarizing potential creates an electric field that points from electrode 21 to electrode 22.

In a conventional binary ferroelectric memory, the direction of polarization is used to store the value of a single bit. For example, polarizations in the up and down directions could correspond to bit values of "1" and "0", respectively. The bit value is written by applying an appropriate voltage across the electrodes of the capacitor. The bit value that is stored in the capacitor is determined by applying a voltage across the electrodes of the capacitor that would normally program the capacitor in the up direction and observing the charge that flows from, or into, one of the electrodes of the capacitor. If the capacitor is in the UP state when the voltage is applied, little charge will flow; however, if the capacitor is in the DOWN state, the state of the capacitor will be switched to the UP state and more charge will flow from or into the electrode in question.

In a conventional binary ferroelectric memory, the programming voltages are set to be sufficiently high to ensure that the dielectric is completely polarized in the desired direction. That is, no additional remanent polarization would be obtained by using a larger programming voltage difference between the electrodes.

The present invention is based on the observation that there is a continuum of remanent polarization states between fully UP and fully DOWN, and that these intermediate states can be programmed by controlling the charge that is transferred to the capacitor. The intermediate state can also be read by measuring the charge that flows when the capacitor is reset to a known fully saturated state.

Refer now to FIG. 2, which illustrates the basic programming principle used in the present invention and one possible programming arrangement. At the beginning of the programming cycle, electrode 26 is programmed in the up direction as indicated by the arrow. This is accomplished by increasing the potential of electrode 26 relative to electrode 27 by an amount that fully polarizes the dielectric layer in the indicated direction using programming source 24.

To set an intermediate polarization state, programming source 24 applies the opposite potential across ferroelectric capacitor 25; however, the current that is allowed to flow is limited so that the time to completely flip the polarization is extended beyond the time that would normally be needed if a non-limited current source were used. The present invention is based on the observation that ferroelectric capacitor 25 will be left in an intermediate polarization state if the process is terminated before the polarization has completely flipped. Hence, if programming source 24 is a constant current source, the state of polarization of ferroelectric capacitor 25 will be a function of the programming time. For example, a timer 28 that determines the length of time that programming source 24 is on can be used to convert an input value to the intermediate polarization state.

Ferroelectric capacitor 25 can be viewed as a charge storage device. The remanent polarization gives rise to a remanent electric field in the dielectric. To cancel this electric field, the charge moves from one electrode of the capacitor to the other, such that the mobile charge creates an electric field that exactly cancels the polarization electric field. Denote the amount of charge that flows from electrode 26 to electrode 27 when the direction of polarization is completely flipped by $Q_{max}$. This charge can be viewed as being stored on one of the electrodes, depending on the direction of polarization of the dielectric. If a charge is now forced onto the opposite plate by the programming source, the state of polarization will be changed by an amount that depends on the amount of charge that is transferred. To force the charge onto the opposite plate, the direction of the applied voltage must be opposite that used to "reset" the ferroelectric capacitor to the known fully polarized state.

Any circuit arrangement that delivers a known charge to the opposite plate can be used to program the ferroelectric capacitor to an intermediate state provided that charge is less than $Q_{max}$ and is delivered at a voltage that alters the remanent polarization such that the charge stored on the capacitor when the programming voltage is removed is altered by the known charge in question. The arrangement discussed above that utilizes a constant current source is one such example, since the charge transferred is equal to the current multiplied by the programming time. However, other arrangements could be utilized.

Refer now to FIG. 3, which illustrates another programming arrangement. In this embodiment, a digital-to-analog converter 32 is used to convert the input value to a voltage that is applied to a capacitor 33 when switch 36 is set to connect digital-to-analog converter 32 to capacitor 33. After capacitor 33 is charged, switch 36 is used to connect capacitor 33 to ferroelectric capacitor 31, which has already been reset. Charge from capacitor 33 then flows into ferroelectric capacitor 31. Denote the voltage on capacitor 33 prior to switching by $V_1$, and denote the voltage on line 34 after switching by $V_2$. Then the charge transferred to ferroelectric capacitor 31 is $C(V_1-V_2)$, where C is the capacitance of capacitor 33. If $V_1>V_2$, the transferred charge is proportional to the input value for a linear digital-to-analog converter. In either case, a calibration curve can be provided that maps the input state to the amount of charge that is transferred. Alternatively, digital-to-analog converter 32 can utilize a non-linear transfer function to compensate for $V_2$.

The intermediate polarization state can be determined by measuring the amount of charge that flows between the electrodes of ferroelectric capacitor 25 when the potential difference is again set to a value such that ferroelectric capacitor 25 is fully programmed in the up direction. Alternatively, the state can be sensed by measuring the amount of charge that must flow into the capacitor to fully program the capacitor in the DOWN state.

Refer now to FIG. 4, which illustrates a simplified readout circuit based on reading the charge stored on the electrodes. For the purposes of this discussion, it is assumed that ferroelectric capacitor 43 was reset to an up polarization as shown by the solid arrow at 46. Data was then stored in ferroelectric capacitor 43 by storing a charge that caused the polarization to decrease in the direction of the dotted arrow. The goal of the readout circuit is to measure that charge when ferroelectric capacitor 43 is again reset to the UP state by providing a readout voltage that is a monotonic function of the stored charge.

The readout operation begins with switch 41 open and switch 44 closed such that capacitor 42 is charged to a potential of V+. After capacitor 42 is charged, switch 44 is opened, and switch 41 is closed. Initially, ferroelectric capacitor 43 will have a potential of V+ across the ferroelectric capacitor. If V+ is sufficiently high, ferroelectric capacitor 43 will be reset to the UP state and the charge, Q, that was stored in ferroelectric capacitor 43 will move to capacitor 42, thereby lowering the potential on capacitor 42 by an amount equal to Q/C, where C is the capacitance of capacitor 42. Hence, the voltage on line 47 will be a function of the charge that was stored on ferroelectric capacitor 43. For this readout scheme to operate over the full range of charges that can be stored on ferroelectric capacitor 43, V+ must be greater than $Q_{max}/C+V_s$ where, $V_s$ is the potential needed to fully reset ferroelectric capacitor 43. It should also be noted that ferroelectric capacitor 43 is reset in the UP state at the end of the readout operation.

The circuit shown in FIG. 4 can also be used to implement the second readout scheme if the V+ power supply is replaced by a V− power supply as shown in FIG. 5, which is a simplified readout circuit according to another embodiment of the present invention. This readout circuit operates in a manner analogous to that described above with reference to FIG. 4. First, switch 44 is closed while switch 41 is open to charge capacitor 42. Switch 44 is then opened followed by switch 41 being closed. The potential is sufficient to cause ferroelectric capacitor 43 to become fully polarized in the down direction. The charge needed to accomplish this is provided by capacitor 42. Hence, the difference in voltages on line 47 before and after switch 41 is closed is a measure of the charge needed to move the polarization of ferroelectric capacitor 43 from its partially polarized state to a fully DOWN state. In this scheme, ferroelectric capacitor 43 must then be reset to the up polarization prior to re-programming.

Refer now to FIG. 6, which illustrates one embodiment of an analog ferroelectric memory according to the present invention. Ferroelectric memory 50 is organized as a plurality of ferroelectric memory cells organized into a plurality of rows and columns. A typical ferroelectric memory cell is labeled at 51. Each ferroelectric memory cell includes a ferroelectric capacitor 52 and an interface circuit 53. All of the ferroelectric memory cells in a row are processed in parallel during read and write operations. The row to be processed is selected by a row select circuit that operates a plurality of row select buses 54 that also include conductors for sequencing the row processing operations during reading and writing. Each ferroelectric memory cell in a given column is connected to two column buses shown at 58 and 59. Column bus 58 is used to readout the data stored in the ferroelectric capacitor in the ferroelectric memory cell being processed, and column bus 59 is used to program the ferroelectric capacitor in a new analog value. Each ferroelectric capacitor can be programmed to be in one of N states, where N>2. The state of a ferroelectric capacitor in a row being processed is ascertained by generating a signal on column bus 58 indicative of the amount of charge that was stored in that ferroelectric capacitor. This state is set using read circuit 62. The state of a ferroelectric capacitor in a row being processed is set by applying signals to column bus 59 connected to that cell via write circuit 61. The signals cause a predetermined amount of charge that is related to the value to be stored in the ferroelectric memory cell to be stored in the ferroelectric capacitor in that ferroelectric memory cell.

Data that is readout of a row is stored in a row buffer 55. In one aspect of the invention, the data is converted from an analog signal representing the charge stored in the corresponding ferroelectric capacitors to a digital value. Since the readout process is destructive, this data must be restored to the row with a write operation even in cases in which no changes in the data are to be made. If changes are to be made, the changes are entered into row buffer 55 after the ferroelectric memory cells in the row have been reset. The data in row buffer 55 is then converted to a charge that is stored in the corresponding ferroelectric capacitors.

The read and write operations utilize a controller 57 that receives an address (ADDR), operation code (OPCODE), and data to be written to the ferroelectric memory cell(s) specified in the address. Data from the indicated address is output on the data lines. Row select circuit 56 applies the appropriate signals to the row select bus specified by the address.

Ferroelectric memory 50 includes two column buses for each column of memory cells, one for reading and one for writing. This arrangement simplifies the following discussion of the detailed embodiments. However embodiments in which only one column bus is needed can also be constructed.

Refer now to FIG. 7, which illustrates one embodiment of a ferroelectric memory according to the present invention that utilizes the storage scheme discussed above in which data is readout by measuring the amount of charge that was stored in the ferroelectric capacitor during the writing operation. To simplify the discussion, only one ferroelectric memory cell in ferroelectric memory 70 is shown. The four row lines R1-R4 are part of the row bus corresponding to the row of memory cells in which ferroelectric memory cell 310 is located. To simplify the following discussion, it will be assumed that the ferroelectric capacitor has been fully polarized to the UP state prior to the write operation by the previous read operation on the ferroelectric capacitor in question. A value is written into ferroelectric memory cell 310 by placing gate 84 in the conductive state and gate 86 in a non-conductive state. Capacitor 77 is then charged to a potential that will result in a charge having a value corresponding to the data being written transferred to ferroelectric capacitor 82 when gate 76 is opened by write circuit 75. The translation of the data to the voltage needed to provide the charge in question is performed by write circuit 75. The voltage on capacitor 77 is less than $V_2$, depending on the data value to be written. When ferroelectric capacitor 82 is connected to write line 73, the top plate will be at a potential that is less than the bottom plate, which is held at $V_2$, and hence, the write operation reverses part of the polarization created by the reset operation.

Data is readout of ferroelectric memory cell 81 in a two-step process by readout circuit 74 that is connected to read line 72 by gate 88. First, capacitor 83 is charged to $V_1$ while being isolated from ferroelectric capacitor 82 by gate 86. Gate 85 is utilized to connect capacitor 83 to $V_1$. Here, $V_1$ is greater than $V_2$ by an amount that allows the maximum design charge to be transferred to capacitor 83 and still have the top plate of capacitor 83 at a voltage greater than $V_2$. The final voltage on capacitor 83 is amplified by source follower 87 and readout by readout circuit 74 which stores the voltage on a capacitor within readout circuit 74. Next, gate 86 is placed in a conducting state which applies voltage on capacitor 83 across ferroelectric capacitor 82. This resets ferroelectric capacitor 82 and causes the charge stored in ferroelectric capacitor 82 to be released, which, in turn, lowers the voltage at the gate of source follower 87. This voltage is then read by readout circuit 74 and subtracted from the voltage stored previously to arrive at a voltage difference that is indicative of the charge that was released by ferroelectric capacitor 82. The resultant analog voltage can then be digitized by an analog-to-digital converter within readout circuit 74. As noted above, ferroelectric capacitor 82 is left in the fully polarized UP state at the end of the readout process. If ferroelectric memory cell 81 is being read, the value that was readout must be restored into ferroelectric capacitor 82 by inputting the data out value to write circuit 75 as described above.

Figure 8A:
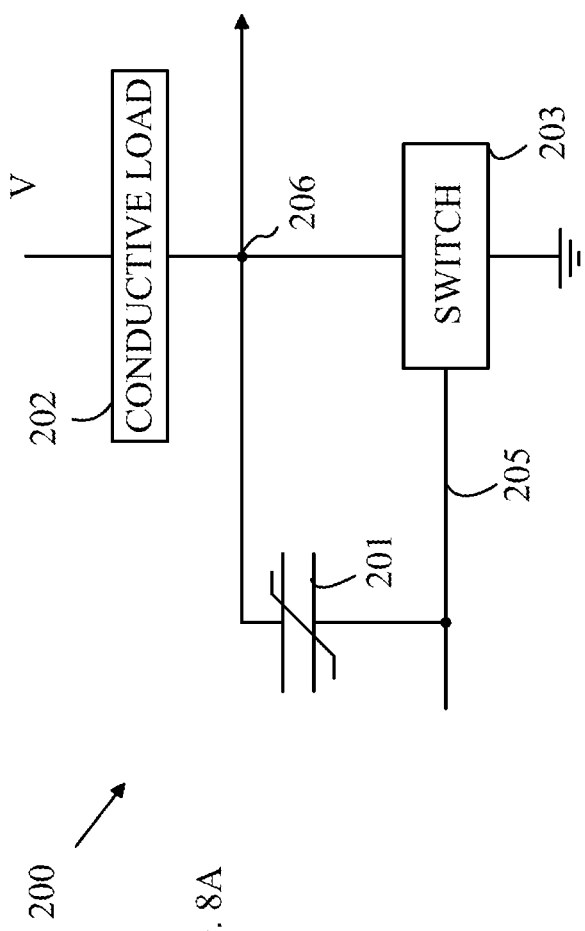
FIG. 8A is a schematic drawing of an autonomous memory circuit.

The ferroelectric memory cell discussed above is one example of a ferroelectric memory cell that could be utilized in the present invention. However, other forms of ferroelectric memory cells could be used. Another embodiment of a ferroelectric memory cell that can be utilized to construct an analog memory is analogous to the autonomous memory circuit described in co-pending application U.S. Ser. No. 12/480,645, which is hereby incorporated by reference. Refer first to FIG. 8A, which is a schematic drawing of an autonomous memory circuit. Autonomous memory circuit 200 includes a ferroelectric capacitor 201 and a switch 203 having a current-actuated control input 205. A conductive load 202 is connected between a power rail and switch 203.

Ferroelectric capacitor 201 has a remanent polarization that can be switched by applying a voltage across ferroelectric capacitor 201. That is, in the absence of a voltage across the capacitor, the dielectric of the capacitor is electrically polarized. The dielectric has two states corresponding to the dielectric being polarized either up or down. If a voltage is applied across the ferroelectric capacitor, an electric field is created in the ferroelectric capacitor. If the field direction is the same as that of the remanent polarization, a small current flows in the circuit connecting the two electrodes of the ferroelectric capacitor. If, on the other hand, the applied electric field is in a direction opposite to that of the remanent polarization, the remanent polarization will change direction to conform to the new field direction, and a large current will flow in the external circuit. The magnitude of the current and the voltage at which it flows can be set by adjusting the composition, area, and thickness of the ferroelectric capacitor.

Switch 203 changes from a high impedance state to a low impedance state when a current enters current-actuated control input 205. In autonomous memory circuit 200, it is assumed that the potential of the input line to switch 203 remains at or near ground independent of the state of the switch. To simplify the following discussion, it will be assumed that the power rail is positive and that the "up" remanent polarization state is set when the positive rail potential is applied across the electrodes of ferroelectric capacitor 201. However, other embodiments in which the input is referenced to power and the output is referenced to ground can be utilized.

First, assume that ferroelectric capacitor 201 is polarized in the UP state. When power is turned on, switch 203 is initially in the off state; hence, the potential at electrode 26 will increase toward V. Thus, the field applied to ferroelectric capacitor 201 will also be in the up direction, and ferroelectric capacitor 201 will not flip states. Accordingly, little current will flow into the input of switch 203, switch 203 will remain off, and the output of autonomous memory circuit 200 will quickly go to the potential of V.

Next, assume that ferroelectric capacitor 201 is polarized in the DOWN state. When power is turned on, the applied electric field across ferroelectric capacitor 201 will be opposite to that of the remanent polarization of ferroelectric capacitor 201, and ferroelectric capacitor 201 will attempt to flip states to match the applied electric field. In this case, a much larger current will flow into the control input of switch 203, and switch 203 will enter the conducting state. Node 206 will rise to an intermediate state that is less than V. The specific potential will depend on the details of the switch and the conductive load. This intermediate state will remain until ferroelectric capacitor 201 finishes switching to its UP state. At that point there will be no more charge flowing out of ferroelectric capacitor 201, and switch 203 will again enter the non-conducting state. Hence, the potential on node 206 will then increase back to V.

Thus, after power is turned on, autonomous memory circuit 200 will have a temporary output that depends on the state of polarization of ferroelectric capacitor 201 for the period of time needed for ferroelectric capacitor 201 to switch states. If ferroelectric capacitor 201 is up when power is turned on and does not switch, the output will go high almost immediately. If ferroelectric capacitor 201 is in the DOWN state when power is turned on and does switch, the output will go to the intermediate state characterized by voltage $V_s$ for the temporary period and then will go high. After that temporary time period, the output will always be high, and ferroelectric capacitor 201 will be in the UP polarization state.

Figure 8B:
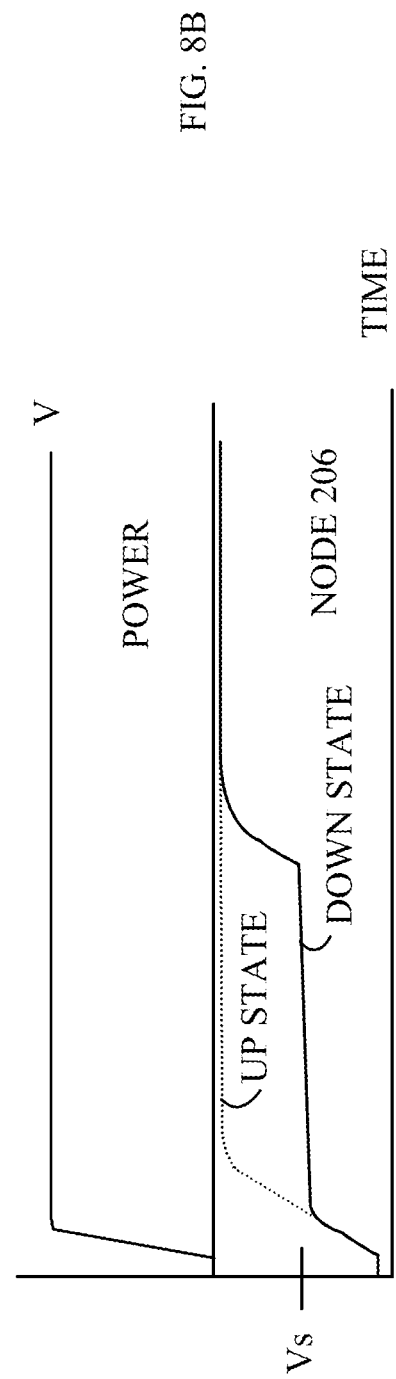
FIG. 8B illustrates the potential on the power rail and on the node as a function of time when an autonomous memory circuit is powered up with the ferroelectric capacitor in the UP and DOWN states.

Refer now to FIG. 8B, which illustrates the potential on the power rail and on node 206 shown in FIG. 8A as a function of time when autonomous memory circuit 200 is powered up with ferroelectric capacitor 201 in the UP and DOWN states. If ferroelectric capacitor 201 is in the DOWN state when autonomous memory circuit 200 is powered up, the potential on node 206 initially increases with the power rail potential until the potential at node 206 reaches a value that causes ferroelectric capacitor 201 to begin to change polarization state. As ferroelectric capacitor 201 begins to flip polarization, a charge is released that causes switch 203 to begin to conduct. If switch 203 begins to conduct too much, the potential on node 206 begins to drop and ferroelectric capacitor 201 stops switching. If switch 203 does not conduct enough, the potential on node 206 rises faster causing ferroelectric capacitor 201 to switch faster forcing more current into the control input of switch 203 increasing its conductivity. Thus, the circuit stabilizes with the potential of node 206 at a specific intermediate value with a slow rate of rise. In this manner, the change in conductivity of switch 203 limits the voltage rise at node 206 until the change in the state of electrode 21 is completed. At this point, no further charge will be released from ferroelectric capacitor 201, and hence, switch 203 will again become non-conducting. The potential during the transition of ferroelectric capacitor 201 will be referred to as the "shelf voltage", $V_s$, in the following discussion. The specific shape of the potential at node 206 will, in general, depend on the specific switch implementation.

An analog ferroelectric memory cell can be constructed from autonomous memory circuit 200. First consider the case in which ferroelectric capacitor 201 is partially polarized. It will be assumed that the polarization of ferroelectric capacitor 201 had been set to the DOWN state, and then a charge indicative of value that is stored in ferroelectric capacitor 201 is introduced into ferroelectric capacitor 201 such that the polarization state is partially moved toward an UP polarization state. The manner in which this is accomplished will be discussed in more detail below.

When autonomous memory circuit 200 is powered up in this partial polarization state, the voltage at node 206 will again rise to the shelf voltage, $V_s$. However, the length of time at which this voltage remains at the shelf voltage will depend on the degree of partial polarization toward the DOWN state. In particular, the length of the shelf period is a function of the charge stored in ferroelectric capacitor 201. Hence, by measuring the length of the shelf period when the cell is powered up, the data value stored in the ferroelectric capacitor can be determined.

In one aspect of the present invention, the autonomous memory cell is used to store an analog value by resetting the ferroelectric capacitor to the DOWN state and then partially switching the ferroelectric capacitor toward the UP state. The writing operation can be viewed as a reset of the autonomous memory cell from the full DOWN state that is interrupted before the autonomous memory cell is fully reset to the UP state. That is, the writing operation moves the potential along the shelf to a point indicative of the data to be stored. The reading operation measures the time needed to complete the switching to the UP state, and hence, determines the charge needed to complete the reset to the UP state.

Figure 9:
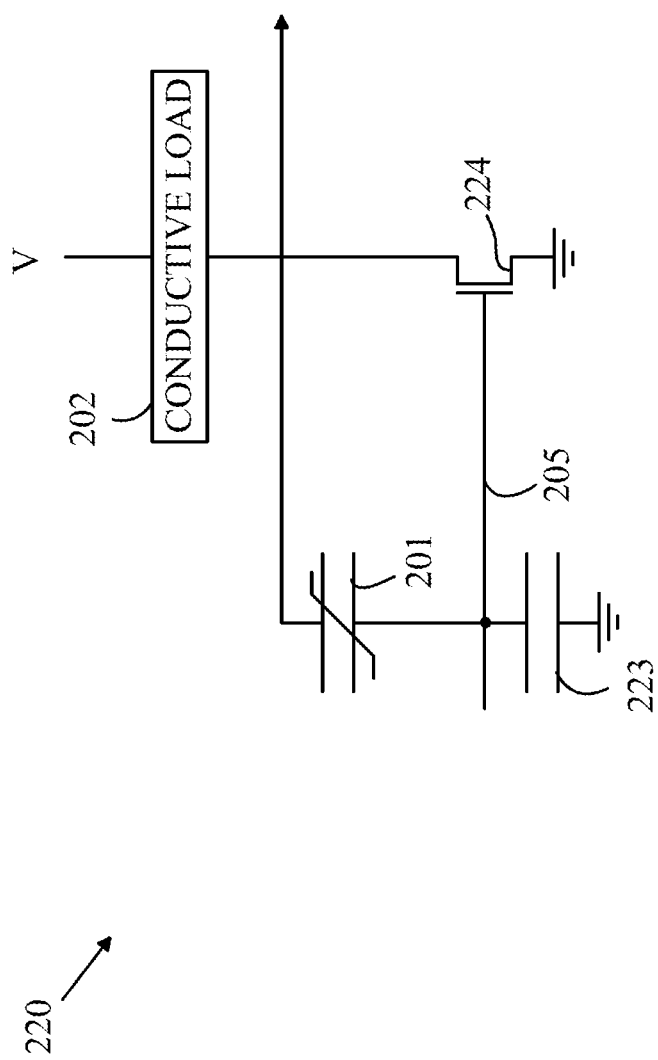
FIG. 9 illustrates an embodiment of an autonomous memory cell.

Refer now to FIG. 9, which illustrates an embodiment of the autonomous memory cell shown in FIG. 8A that has been implemented using a CMOS FET 224 as the switching element. In autonomous memory cell 220, a capacitor 223 acts as charge-to-voltage converter that converts the charge that flows into and out of ferroelectric capacitor 201 to a voltage that operates CMOS FET 224.

Figure 10:
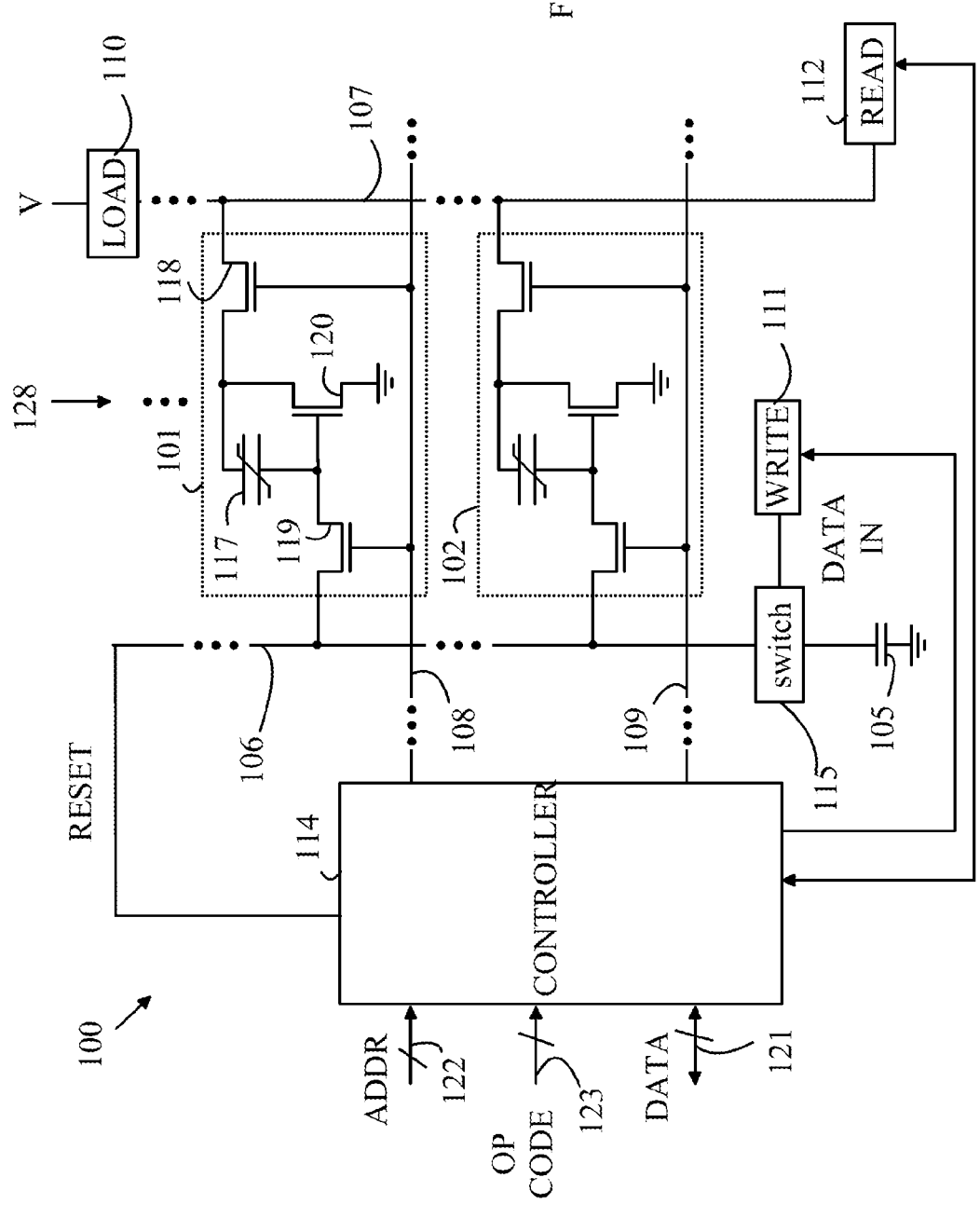
FIG. 10 illustrates another embodiment of a multi-state ferroelectric memory according to the present invention.

Refer now to FIG. 10, which illustrates another embodiment of a multi-state ferroelectric memory according to the present invention. Ferroelectric memory 100 includes a plurality of rows and columns of ferroelectric memory cells of which ferroelectric memory cells 101 and 102 are typical. Ferroelectric memory 100 is constructed from a plurality of rows and columns of such ferroelectric memory cells. To simplify the drawing, only one column 128 of ferroelectric memory cells is shown. The ferroelectric memory cells in each column are connected to a read line and a write line. The read and write lines corresponding to column 128 are shown at 107 and 106, respectively. The read/write operations of ferroelectric memory 100 are controlled by controller 114, which receives an address on ADDR bus 122, an operation code on bus 123, and either data to be written into ferroelectric memory 100 or outputs data read from the address in question on data bus 121.

Each ferroelectric memory cell includes a ferroelectric capacitor such as ferroelectric capacitor 117 and three CMOS FETs, such as FETs 118, 119, and 120. FETs 118 and 119 act as gates for connecting the ferroelectric memory cell to the read and write lines in response to a signal on a row select line. Typical row select lines are shown at 108 and 109. FET 120 provides the switch function discussed above with reference to FIG. 8A.

The capacitor 105 acts as a charge-to-voltage converter for the ferroelectric memory cell that is currently selected. Since the charge-to-voltage conversion function is only needed during the read operation in ferroelectric memory 100, a single capacitor for each row can be utilized instead of utilizing an individual capacitor in each cell as shown in FIG. 2. This aspect of the present invention saves a significant amount of space relative to embodiments that have a capacitor or other charge-to-voltage converter in each cell.

Similarly, all of the ferroelectric memory cells in column 128 share a common load 110. Hence, each ferroelectric memory cell requires only the three FETs and one ferroelectric capacitor to implement the memory cell discussed in FIG. 9.

Data is written into the currently-selected ferroelectric memory cell by first resetting the corresponding ferroelectric capacitor to the DOWN state and then partially resetting that ferroelectric capacitor in the UP direction by an amount that depends on the data value being stored. The following discussion uses only positive voltages; however, embodiments that utilize negative voltages can also be constructed. The specific ferroelectric memory cell that is to be selected is determined by controller 114 from the value on the ADDR bus 122. The value to be written is received on data bus 121. Controller 114 resets the ferroelectric memory cell by setting the potential on write line 106 to V with switch 115 in the non-conducting state. In one aspect of the invention, read line 107 is connected to ground through read circuit 112. Hence, a potential of V is applied to the ferroelectric capacitor in a direction that polarizes the ferroelectric capacitor in the DOWN state. V is chosen such that the ferroelectric capacitor is completely polarized in the DOWN state.

After the ferroelectric capacitor has been polarized in the DOWN state, write line 106 is disconnected from controller 114 and read line 107 is likewise disconnected from ground. The data that is to be input to the ferroelectric capacitor is input to write circuit 111 in digital form. Write circuit 111 maps the digital value to a time value that represents the time switch 115 is to be placed in the conducting state. The data is written by placing switch 115 in the conducting state for the time in question. In essence, the flipping of the polarization that would occur is interrupted before the polarization can completely flip.

Data is read from the currently-selected ferroelectric memory cell by connecting the ferroelectric memory cell to read line 107 and placing switch 115 in the conducting state. The specific ferroelectric memory cell is determined by the address on ADDR bus 122. Read circuit 112 measures the time needed for the voltage on read line 107 to transition from the shelf voltage to a predetermined voltage that is near V. The measured time is then converted to a digital value that is read by controller 114 and transferred to data bus 121. Controller 114 then initiates a write cycle with the data value in question by transferring that data to write circuit 111.

In the embodiment shown in FIG. 10, the ferroelectric capacitor is initialized in the DOWN state and then partially written toward the UP state. However, embodiments analogous to that shown in FIG. 10 in which the ferroelectric capacitor is reset to be polarized in the UP direction and then written by metering charge onto the capacitor that moves the polarization toward the DOWN direction can also be constructed.

In the embodiment shown in FIG. 10, the write operation is performed by metering a charge onto the ferroelectric capacitor by interrupting a reset operation after a period of time that depends on the value being written. However, other methods for metering the charge onto the ferroelectric capacitor could be utilized. For example, the charge metering scheme discussed above with reference to FIG. 7 could also be utilized.

Figure 11:
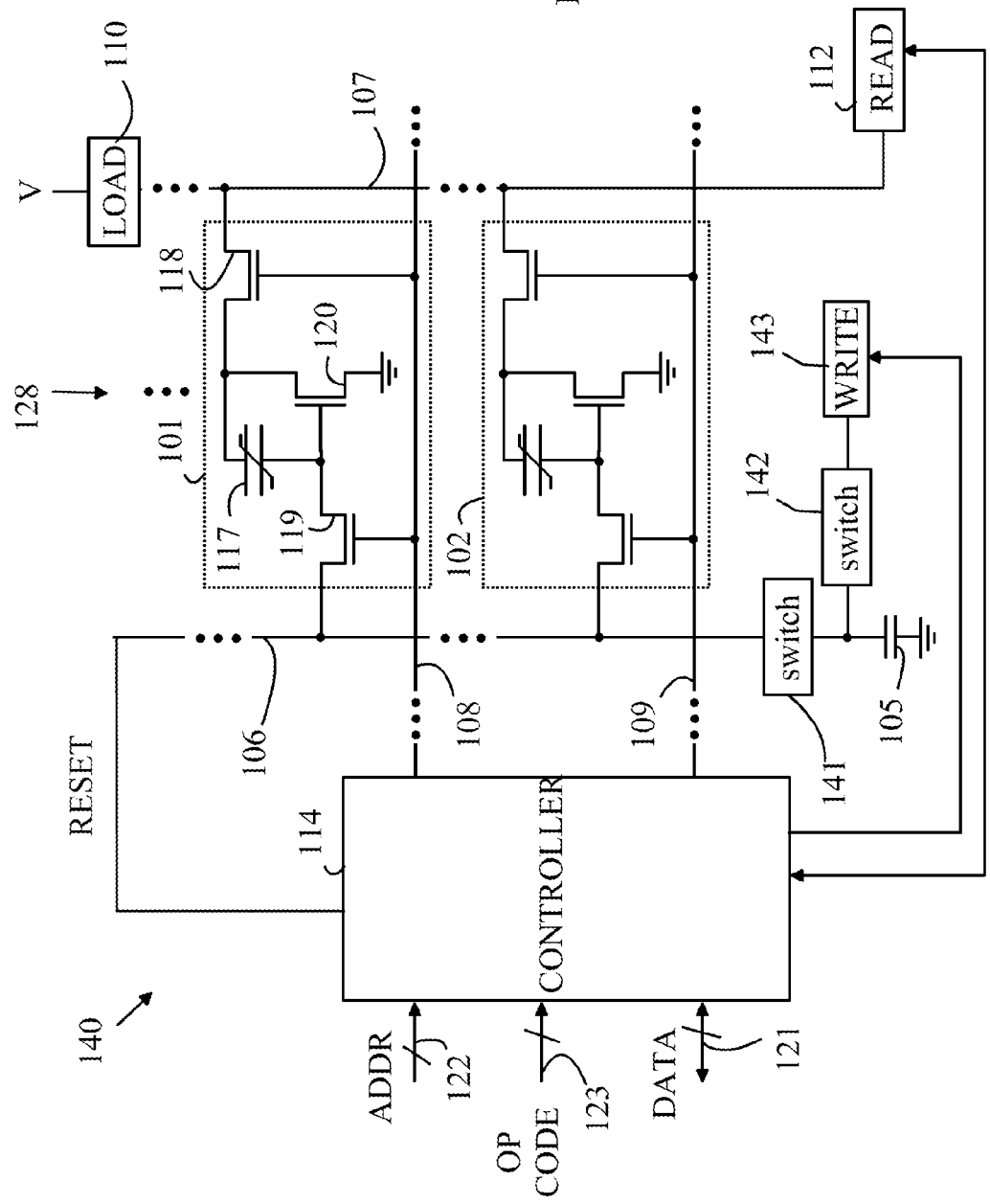
FIG. 11 illustrates a ferroelectric memory according to another embodiment of the present invention.

Refer now to FIG. 11, which illustrates a ferroelectric memory according to another embodiment of the present invention. Ferroelectric memory 140 utilizes a fixed charge transfer to write the ferroelectric capacitors. To simplify the following discussion, those elements of ferroelectric memory 140 that serve functions analogous to elements in ferroelectric memory 100 have been given the same numerical designations. Data is written into the ferroelectric capacitor in the selected ferroelectric memory cell by first resetting the ferroelectric capacitor in the DOWN state in the same manner as described for ferroelectric memory 100. Data is then written by partially polarizing the ferroelectric capacitor toward the UP state. The data to be written is first converted to a charge that is applied to capacitor 105 by write circuit 143. In this loading phase, switch 141 is open and switch 142 is closed. The charge is then transferred to the ferroelectric capacitor by opening switch 142 and closing switch 141.

The above-described embodiments of the invention have utilized CMOS FETs for the transistors that implement the basic autonomous memory cell that is used to store the data. However, embodiments that utilize bipolar transistors, ferroelectric FETs, FETs, amplifiers, ferroelectric relays, ferromagnetic relays and electrostatic MEM switches could also be utilized to construct a ferroelectric memory according to the present invention. Autonomous memory cells based on these devices are described in detail in co-pending U.S. patent application Ser. No. 12/480,645 filed on Jun. 9, 2009, which is hereby incorporated by reference in its entirety.

The above-described embodiments of the present invention assume that a ferroelectric capacitor is purely a charge storage device. In practice, a ferroelectric capacitor can be viewed as a charge storage device in parallel with a capacitor that stores charge that is not associated with the electric field created by the remanent polarization of the ferroelectric material. In the following discussion, this capacitance will be referred to as the non-remanent polarization capacitance, and the associated capacitor will be referred to as the non-ferroelectric capacitor. The term ferroelectric capacitor will continue to be used for the device in which charge is stored in response to the remanent polarization of the ferroelectric material in the device. As the potential on the ferroelectric capacitor is switched, charge is stored on, or removed from, the storage element and the associated non-ferroelectric capacitor. For the purposes of this application, the charge that is stored in the storage device associated with the ferroelectric capacitor will be referred to as the "charge stored in the ferroelectric capacitor".

Figure 12:
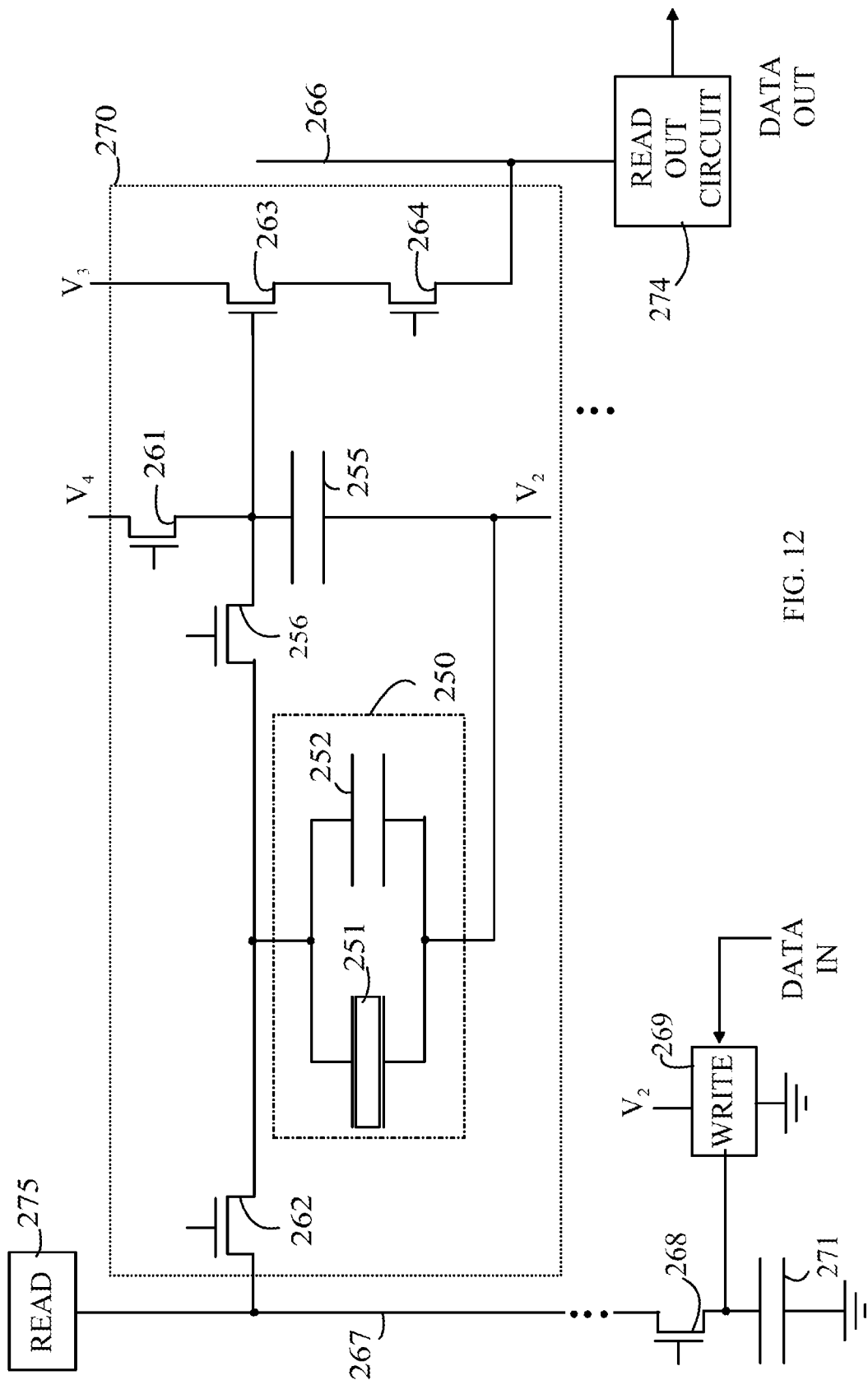
FIG. 12 illustrates another embodiment of a ferroelectric memory according to the present invention.

If the charge moved to/from the associated non-ferroelectric capacitor is small compared to the charge that is moved to/from the storage device, the associated non-ferroelectric capacitor can be ignored. However, embodiments that take into account the associated non-ferroelectric capacitor of the ferroelectric capacitor can provide improved resolution thereby allowing embodiments having increased numbers of states to be constructed. Refer to FIG. 12, which illustrates another embodiment of a ferroelectric memory according to the present invention. To simplify the drawing, only one ferroelectric memory cell is shown. Ferroelectric memory cell 270 is similar to ferroelectric memory cell 81 shown in FIG. 7; however, the manner in which the ferroelectric memory cell is readout has been altered to take into account the associated non-ferroelectric capacitor 252 in the ferroelectric capacitor shown at 250. The charge storage component is shown at 251.

First, consider the manner in which data is written into storage device 251 in the presence of non-ferroelectric capacitor 252. The goals of the write circuitry and procedure are to store a charge Q in storage device 251, where Q is determined by the data to be stored. A first approximation to Q can be stored in the combination of storage device 251 and associated non-ferroelectric capacitor 252 by charging capacitor 271 to a predetermined voltage that depends on Q and then placing gate 268 in the conducting state while holding gate 262 in the non-conducting state. The potential on write line 267 is then read and recorded by read circuit 275; denote this potential by $P_1$. Gate 262 is then placed in the conducting state, and the potential on write line 267 is read a second time. Denote the second potential by $P_2$. The charge that entered ferroelectric capacitor 250 is given by $|P_1-P_2|/C_{271}$, where $C_{271}$ is the capacitance of capacitor 271. This charge is stored either on associated non-ferroelectric capacitor 252 or in storage device 251. The charge that is stored in associated non-ferroelectric capacitor 252 is given by $|P_2-V_2|/C_{252}$, where $C_{252}$ is the capacitance of associated non-ferroelectric capacitor 252. If $C_{252}$ is known from the design parameters of the ferroelectric memory, then this charge, and hence the charge stored on storage device 251 as a result of the write operation is known. If the charge stored on storage device 251 is not equal to the charge corresponding to the data value that is to be stored, a second write operation that utilizes a different $P_1$ can be performed to force an additional increment of charge onto storage device 251, and the procedure repeated until the desired amount of charge has been stored on storage device 251.

The above-described write procedure assumes that the value of associated non-ferroelectric capacitor 252 is known to sufficient accuracy. It should be noted that this value could vary slightly from ferroelectric capacitor to ferroelectric capacitor in the memory. Accordingly, a procedure that determines the $C_{252}$ during the write procedure could be needed. In one aspect of the present invention, $C_{252}$ is determined as follows: It is assumed that storage device 251 is fully saturated in the DOWN state, and that the potential across ferroelectric capacitor 250 is set to zero by connecting write line 267 to $V_2$ through write circuit 269. Ferroelectric capacitor 250 is then isolated from write line 267. Hence, at the start of the procedure, there is no charge on non-ferroelectric capacitor 252, and no further charge can be loaded onto storage device 251 by a potential difference caused by a potential on write line 267 that is less than $V_2$.

First, capacitor 271 is charged to $P_2$, which is less than $V_2$ with gate 268 in the non-conducting state. After being so charged capacitor 271 is isolated from write circuit 269 by a gate that is internal to that write circuit, and gate 268 is placed in the conducting state while gate 262 remains non-conducting. The potential on write line 267 will be $P_2$ or a value very close to that value. Read circuit 275 measures that potential, and then gate 262 is placed in the conducting state. Since the potential across storage device 251 cannot force additional charge into, or out of, storage device 251, only the charge on non-ferroelectric capacitor 252 can move. Any charge that moves will be the result of the voltage difference across associated non-ferroelectric capacitor 252 between the final potential $P_3$ and $P_2$. The charge that moves is stored on capacitor 271. Denote the potential on write line 267 after gate 262 is put in the conducting state by $P_3$. Then the charge that moved is $Q_m=|P2-P_3|/C_{271}$. Hence, $C_{252}=Q_m/|P_2-P_3|$. Accordingly, the write circuitry can compensate for variations in associated non-ferroelectric capacitor $C_{252}$ from ferroelectric capacitor to ferroelectric capacitor.

At the end of a write operation, any charge that is stored on associated non-ferroelectric capacitor 252 is removed by setting the potential on write line 267 to $V_2$ utilizing write circuit 269 and connecting ferroelectric capacitor 250 to write line 267. This removes any potential difference across non-ferroelectric capacitor 252 and storage device 251. The charge in storage device 251 is not altered by this operation. However, any charge that is left in non-ferroelectric capacitor 252 is removed.

A read operation can be accomplished in an analogous manner. The read operation starts in a manner analogous to that described above. While ferroelectric capacitor 250 is isolated from capacitor 255, capacitor 255 is charged to a first potential, $V_4$ utilizing gate 261. The actual value of the potential on capacitor 255 is readout by readout circuit 274 through source follower 263 and gate 264 and stored as $P_5$ that couples the potential onto read line 266. This potential is stored in readout circuit 274. Next, gate 256 is placed in the conducting state. The potential $V_4$ is set such that $V_4-V_2$ is above the potential that will reset ferroelectric capacitor 250 to the fully polarized UP state. Hence, any charge that is stored on storage device 251 is ejected from storage device 251 and moves to capacitors 252 and 255, which are now connected in parallel. The voltage at the gate of source follower 263 is then readout again. Denote this voltage by $P_6$. The charge that was stored on storage device 251 is $Q=|P_5-P_6|/(C_{252}+C_{255})$. If $C_{252}$ is known, the readout is complete, except for digitizing the result.

If $C_{252}$ is not known, it can be determined in a manner analogous to that described above. For example, $V_4$ can be increased to a potential $P_6$, above $P_5$ and capacitor 255, and charged to $P_6$ while associated non-ferroelectric capacitor 252 is isolated from capacitor 255. The potential across capacitor 255 is set to zero by setting write line 267 to $V_2$. Hence, when gate 256 is set to the conducting state, charge will flow from capacitor 255 to associated non-ferroelectric capacitor 252, resulting in the potential at capacitor 255 decreasing. The relative sizes of capacitors 255 and 252 can then be determined from the amount of this potential decrease, and hence, the charge measured from ferroelectric memory cell 270 by readout circuit 274 can be corrected for the associated non-ferroelectric capacitance in ferroelectric capacitor 250.

The above-described embodiments of the present invention are directed to digital memories in which each ferroelectric memory cell stores and retrieves a digital value. However, embodiments in which an analog value is stored and retrieved can also be constructed. In such embodiments, the write circuit receives an analog voltage rather than a digital value that is converted to a charge that is stored on the ferroelectric capacitor. The read circuit then outputs the analog value representing the charge that was stored on the ferroelectric capacitor.

The above-described embodiments utilize a scheme in which the ferroelectric capacitor is reset to a known state, written once, and then read. However, embodiments in which the ferroelectric capacitor is written multiple times after being reset can also be constructed. Such embodiments provide an "accumulator" function. For example, a ferroelectric capacitor is first reset to the DOWN state and then a first charge $Q_1$ is transferred to the ferroelectric capacitor that moves the polarization toward the UP state. Some time later, a second charge $Q_2$ is transferred to the ferroelectric capacitor that moves the ferroelectric capacitor further toward the UP state, and so on. When the ferroelectric capacitor is finally read, the output will be equal to the sum of the Q values. Hence, the ferroelectric capacitor will have acted as an analog summing circuit.

A known polarization state can be obtained by resetting the ferroelectric capacitor to the UP state and then transferring a known charge that moves the polarization toward the DOWN state.

It should be noted that a more general accumulation function could be constructed by resetting the ferroelectric capacitor to a state that is between the UP and DOWN states. This can be accomplished by resetting the ferroelectric capacitor to the DOWN state and then storing a known charge that tends to move the ferroelectric capacitor toward the UP state. Charges can now be transferred to the ferroelectric capacitor that moves the polarization either toward the UP state or the DOWN state by setting both the magnitude of the charge and the polarity of the charging voltage. For example, the digital-to-analog converter shown at 32 in FIG. 3 could be configured to charge capacitor 33 either with a positive potential or a negative potential. When the ferroelectric capacitor is finally read, the result will be the sum of the charges that were stored provided the total stored charge at each intermediate state did not exceed $Q_{max}$.

In a subset of the multiple write embodiments, each write moves a fixed charge to the ferroelectric capacitor. In this case, the value finally written to the ferroelectric capacitor is just the sum of the pulses. This mode can be used to program the ferroelectric capacitor by using a digital data value that is to be stored to set the number of pulses.

In the above-described embodiments, the write circuit is part of the memory. However, embodiments in which the write circuit is outside of the memory could also be constructed. The amount of power needed to force a charge onto the ferroelectric capacitor is small. Consider the case in which the memory cell has a single memory cell. Refer again to FIG. 3. The write circuit includes digital-to-analog converter 32 and capacitor 33 and switch 36. If ferroelectric capacitor 31 is the only ferroelectric capacitor that is "exposed" to this write circuit, the power stored in capacitor 33 is sufficient to write the state or add additional charge to that already stored in ferroelectric capacitor 31. In this sense, the rest of the circuitry that includes ferroelectric capacitor 31 does not need to be powered during the write or accumulation functions described above. In memories that have only one ferroelectric capacitor exposing this capacitor for external write is easily accomplished. For example, refer again to FIG. 7. If ferroelectric memory cell 81 is the only memory cell in the memory, gates 84 and 88 could be omitted. If write circuit 75 can provide both negative and positive voltage levels, $V_2$ can be set to ground. The state of ferroelectric capacitor 82 can then be set by connecting an external write circuit to line 73. To read the state of ferroelectric capacitor 82, ferroelectric memory cell 81 would be connected to a readout circuit on line 72 and the circuitry needed to read the charge released from ferroelectric capacitor 82 when ferroelectric capacitor 82 is reset. In memories having a plurality of such ferroelectric capacitors, the addressing circuitry must also be configured to be powered from the external write circuit.

In the above-described embodiments, the ferroelectric capacitor is programmed by setting a charge that is transferred to the ferroelectric capacitor after the ferroelectric capacitor has been set to a known starting state. Refer again to FIGS. 8A and 8B. In this embodiment of ferroelectric capacitor memory cell, the data is stored by interrupting the "flip" of the state from DOWN to UP. In the above-described embodiments this is accomplished by limiting the charge transfer or using some form of timer to stop the process when the desired point is reached. It should be noted that the shelf voltage region is actually characterized by a shelf voltage that increases with time. The slope of this shelf voltage region depends on the particular ferroelectric capacitor being utilized. If the voltage, V, shown in FIG. 8A is set to a value that is reached during the shelf region, the flipping process will not be completed. Instead, the ferroelectric capacitor will be held at the partially polarized state characterized by V. Accordingly, the state of the ferroelectric capacitor could be set by fully polarizing the ferroelectric capacitor in the DOWN state and then applying a voltage V that is determined by the data to be stored.

Refer now to FIG. 13A, which illustrates another embodiment of a write circuit that can be utilized to set the state of polarization of the ferroelectric capacitor. Ferroelectric memory cell 300 is similar to the memory cell discussed above with reference to FIG. 8A, and hence, elements that serve the same function as elements discussed with respect to FIG. 8A have been given the same numerical designations. In ferroelectric memory cell 300, conductive load 202 is connected to a write circuit 301 that determines the potential that is applied to ferroelectric capacitor 201. In addition, write circuit 301 sets the potential on current-actuated control input 205. Prior to writing data into ferroelectric capacitor 201, write circuit 301 applies a potential difference, V, across ferroelectric capacitor 201 that resets ferroelectric capacitor to the DOWN state. Data is then written to ferroelectric capacitor 201 by converting the input data to a voltage $V_d$ that is between the minimum and maximum shelf voltages, $V_{min}$ and $V_{max}$, as shown in FIG. 13B. This potential is applied to conductive load 202 as shown in FIG. 13A. Once node 206 reaches $V_d$, no further charge will be transferred into ferroelectric capacitor 201, and hence, the write operation will terminate leaving ferroelectric capacitor 201 in the desired state.

A similar strategy can be used to construct a non-destructive read operation. When power is applied to the programmed ferroelectric capacitor by setting the potential at the conductive load to a value that is greater than the shelf voltage at which the ferroelectric capacitor was programmed, the voltage at node 206 rises to the shelf voltage that was present at the end of the write cycle. This voltage is read by read circuit 302, and then the potential returned to a level below the shelf voltage. The state of the ferroelectric capacitor will not have changed significantly, provided the charge transferred into or out of the ferroelectric capacitor during the time the potential was above the voltage in question is small. The transferred charge can be minimized by setting the conductive load during the read process sufficiently high and the difference in voltage between the applied voltage and the read shelf voltage as small as possible. For example, the read voltage could be set to $V_{max}$. The shelf voltage that was read can then be translated into the data value that was stored in the ferroelectric memory cell.

The circuit shown in FIG. 13A can also be utilized to implement other readout schemes. As noted above, one method for reading the state of ferroelectric capacitor 201 is to determine the charge needed to complete the transition to the fully polarized UP state from the current state. Referring again to FIG. 13B, in one aspect of the invention, the read circuit determines the difference between the time at which the voltage at node 206 reaches the shelf region, $T_s$ and the time at which the voltage leaves the shelf region, $T_f$ when the write circuit applies a potential of V to the conductive load. The time can be measured directly or determined indirectly by pulsing the conductive load and counting the number of pulses needed to bring the potential at node 206 to $V_f$ during the pulse.

Refer again to FIG. 7. The size of capacitor 83 must be significantly larger than ferroelectric capacitor 82 to provide sufficient charge to flip the polarization of ferroelectric capacitor 82. Hence, this capacitor significantly increases the size of the memory cell. In addition, as noted above, variations in the capacitance can cause problems as noted above. These problems can be reduced by moving the capacitor 83 outside the memory cell such that the capacitor is shared by all of the memory cells in the column. This allows the capacitance to be measured and stored by the controller as well as reducing the cell size.

Figure 14:
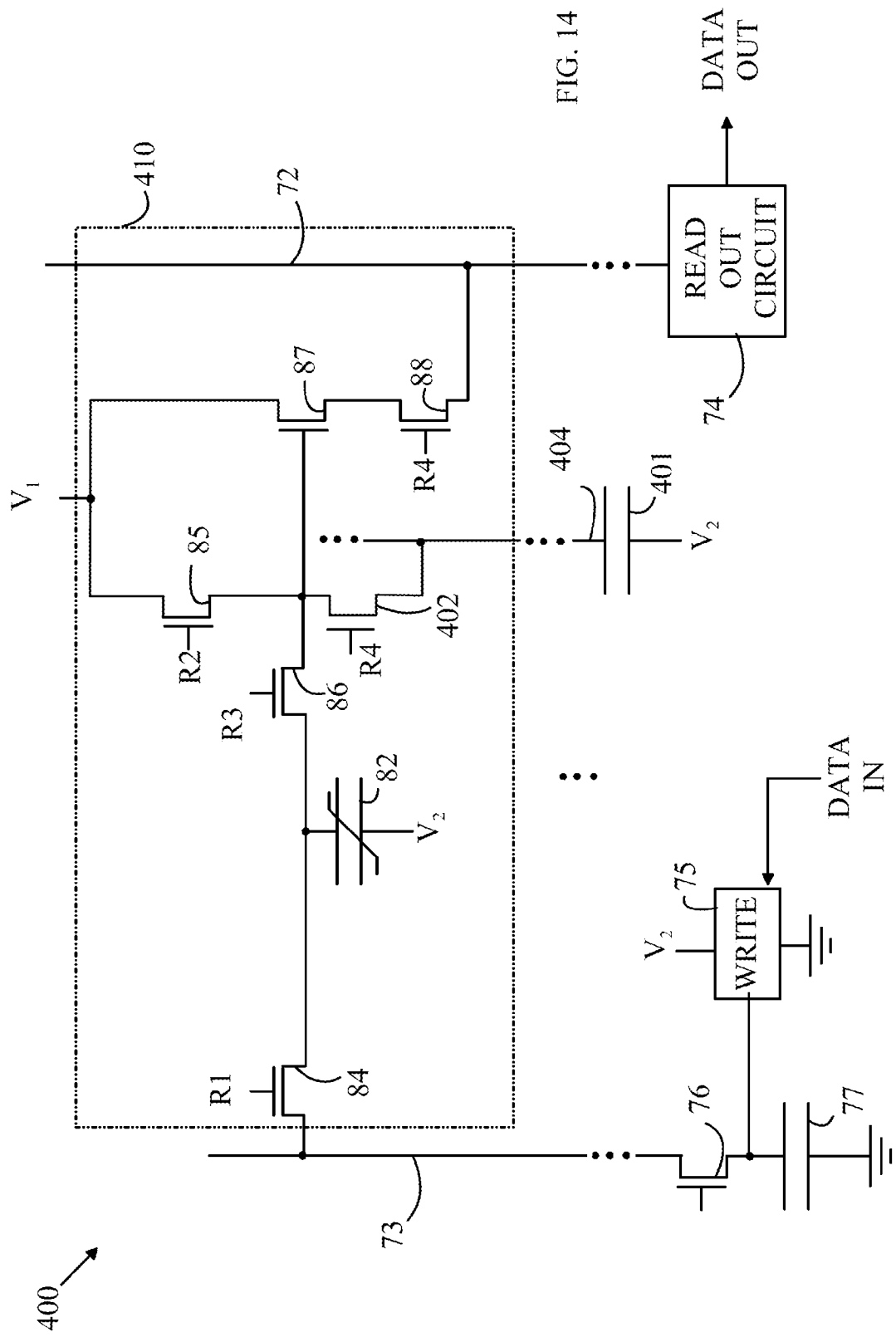
FIG. 14 illustrates another embodiment of a ferroelectric memory according to the present invention.

Refer now to FIG. 14, which illustrates another embodiment of a ferroelectric memory according to the present invention. Ferroelectric memory 400 is similar to ferroelectric memory 70 shown in FIG. 7 in operation. To simplify the following discussion, elements of ferroelectric memory 400 that serve functions analogous to those of ferroelectric memory 70 have been given the same numeric designations. Ferroelectric memory 400 differs from ferroelectric memory 70 in that capacitor 83 shown in FIG. 7 in each memory cell has been replaced by capacitor 401, which is located outside the memory cells and is shared by all of the memory cells in the column. Within ferroelectric memory cell 410, a gate 402 connects the gate of source follower 87 to a line 404 that is connected to write circuit 301 when ferroelectric memory cell 410 is selected for reading or writing.

The above-described embodiments of the present invention utilize PZT ferroelectric capacitors. However, other ferroelectric materials could be utilized for the dielectric medium in the ferroelectric capacitors. For example, ferroelectric capacitors based on PLZT, PLT, barium titanate, bismuth ferrite, PVDF, lithium niobate, Y1 ceramics such as Strontium Bismuth Tantalate Niobate, and various organic polymers such as PVDF could be utilized.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. A memory circuit comprising
    a ferroelectric capacitor characterized by a stored charge that is stored in said ferroelectric capacitor when said ferroelectric capacitor is not powered, said stored charge representing a stored data value
    a reset circuit that causes said stored charge to be equal to a predetermined stored charge;
    a write circuit that receives a plurality of input data values after said reset circuit caused said stored charge to be equal to said predetermined stored charge, converts each of said plurality of input data values to a corresponding charge that is independent of said stored charge in said ferroelectric capacitor and causes said corresponding charges to be added to said stored charge; and
    a read circuit that determines said stored charge and generates a sum data value indicative of a sum of said plurality of input data values.

2. The memory of claim 1 wherein said read circuit comprises
    a capacitor reset circuit for setting said ferroelectric capacitor to a predetermined state of polarization; and
    a circuit that measures a charge leaving said ferroelectric capacitor when said ferroelectric capacitor polarization is set to said predetermined state of polarization.

3. The memory of claim 1 wherein said read circuit comprises a circuit that measures an amount of charge needed to cause said ferroelectric capacitor to enter a predetermined state of polarization.

4. The memory of claim 1 wherein said ferroelectric capacitor is characterized by a maximum charge, $Q_{max}$, that can be stored in said ferroelectric capacitor, and wherein said write circuit comprises
    a capacitor charging circuit;
    a write capacitor that can be alternately connected to said capacitor charging circuit and said ferroelectric capacitor, said write capacitor being connected to said capacitor charging circuit when one of said input data values is received and charged to a voltage that depends on said one of said input data values; and
    a ferroelectric capacitor write circuit that disconnects said write capacitor from said capacitor charging circuit after said write capacitor has been charged and then connects said write capacitor to said ferroelectric capacitor such that a charge in said write capacitor is transferred to said ferroelectric capacitor, said charge being less than $Q_{max}$ for at least two of said input data values.

5. A method for storing data in a ferroelectric capacitor that stores a remnant charge, said method comprising:
    resetting said ferroelectric capacitor to a predetermined polarization state, characterized by a reset remnant charge that is stored in said ferroelectric capacitor, said reset remnant charge being representative of an initial data value;

receiving a plurality of input data values;

converting each of said input data values to a corresponding charge that is independent of said remnant charge currently stored in said ferroelectric capacitor; and causing each of said corresponding charges to be added to said remnant charge such that said remnant charge represents a sum of said initial data value and input data values after said corresponding charges have been added.

6. The method of claim 5 further comprising:

resetting said ferroelectric capacitor to a predetermined polarization state after said plurality of corresponding charges have been added to said remnant charge;

measuring a sum charge that flows from said ferroelectric capacitor during said resetting; and converting said sum charge to an output data value equal to said sum of said initial data value and input data values.

7. The method of claim 5 further comprising:

measuring an amount of charge that must be added to said remnant charge in said ferroelectric capacitor to cause said ferroelectric capacitor to enter a predetermined state of polarization; and determining an output data value equal to said sum of said initial data value and input data values from said measured amount of charge.

* * * * *